United States Patent
Shih et al.

(10) Patent No.: US 6,180,492 B1
(45) Date of Patent: *Jan. 30, 2001

(54) METHOD OF FORMING A LINER FOR SHALLOW TRENCH ISOLATION

(75) Inventors: Hsueh-Hao Shih, Hsinchu; Tri-Rung Yew, Hsinchu Hsien; Water Lur, Taipei; Gwo-Shii Yang, Hsinchu, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/237,298

(22) Filed: Jan. 25, 1999

(51) Int. Cl.[7] .................................................. H01L 21/76
(52) U.S. Cl. ..................... 438/435; 438/424; 438/437; 438/787
(58) Field of Search ..................... 438/424, 430, 438/435, 437, 787, 788

(56) References Cited

U.S. PATENT DOCUMENTS

| | | | |
|---|---|---|---|
| 4,471,525 | * 9/1984 | Sasaki | 29/576 W |
| 5,155,571 | * 10/1992 | Wang et al. | |
| 5,541,440 | * 7/1996 | Kozai et al. | 257/513 |
| 5,633,212 | * 5/1997 | Yuuki | 438/773 |
| 5,668,026 | * 9/1997 | Lin et al. | 438/272 |
| 5,747,846 | * 5/1998 | Iida et al. | 257/314 |
| 5,786,263 | * 7/1998 | Perera | 438/431 |
| 5,834,358 | * 11/1998 | Pan et al. | 438/424 |
| 5,858,830 | * 1/1999 | Yoo et al. | 438/241 |
| 5,861,347 | * 1/1999 | Maiti et al. | 438/787 |

* cited by examiner

Primary Examiner—Long Pham

(57) ABSTRACT

An improved method for forming shallow trench isolation structure is described. The present method comprises the steps of providing a pad oxide layer and a mask layer on a semiconductor substrate and forming a trench structure therein. Next, a liner oxide layer is formed on the surface of the trench structure in the semiconductor substrate and is extensively formed on the side surface of the mask layer exposed therein and the top surface of the mask layer by wet oxidation. A dielectric material is deposited on the liner oxide layer and fills the trench structure. The dielectric material layer is planarized. The mask layer and the pad oxide layer are then removed to form the isolation structures. The method for forming the shallow trench structures on a semiconductor structure in accordance with the present invention can eliminate the kink effect that occurs in the conventional method.

11 Claims, 4 Drawing Sheets

METHOD OF FORMING A LINER FOR SHALLOW TRENCH ISOLATION

BACKGROUND OF THE INVENTION

1. Field of the Invention

This invention in general relates to a method for forming semiconductor devices and more particularly, to a method for forming shallow trench isolations (STI) structure on a semiconductor substrate.

2. Description of the Related Art

Isolation structure on a semiconductor substrate is used to prevent carriers from migrating to the adjacent devices. Typically, the isolation structure is formed in a semiconductor substrate with densely packed devices, such as in DRAM or in field effect transistor (FET) devices, for mitigating leakage current induced along the edges of EFT devices.

One method for forming the isolation structure in the semiconductor substrate is local oxidation. However, there are some inherent problems in local oxidation technology, such as the stress of the isolation structure or bird's beak encroachment incurred thereby. Therefore, in high-density semiconductor devices, the use of shallow trench isolation structure is proposed.

The method for forming shallow trench isolation structures in semiconductor substrate comprises the application of anisotropic etching on a semiconductor substrate to form trenches therein and then filling the trenches with dielectric material. Since the field isolation effect provided by the shallow trench isolation structures is scaleable and the Bird's Beak Encroachment in field oxidation is also resolved, the technology of shallow trench isolation structure has become a trend in the technology of semiconductor.

FIGS. 1A to 1B schematically illustrate in cross-sectional representation of the conventional method for forming a shallow trench isolation structure. Referring to FIG. 1A, a pad oxide layer 102 and a silicon nitride layer 104 are provided on a substrate 100. The silicon nitride layer 104 is patterned as a mask to etch a trench 106 in the substrate 100. Then, a liner oxide layer 108 is formed on the surface of substrate exposed in the trench 106 by dry oxidation. Next, a silicon oxide layer 110 is overlaid on the substrate 110 and fills the trench 106 therein. Now referring to FIG. 1B, the oxide layer 110 is removed by chemical mechanical polishing until the silicon nitride layer 104, which is used as a stop layer, is exposed. Next, the silicon nitride layer 104 is removed and then, the pad oxide layer 102 is removed by hydrofluoric acid. A trench isolation structure 112 is formed to completion in the substrate 100.

In the above-described method, the silicon oxide layer 110 covered on the substrate is formed by chemical deposition, while the pad oxide layer is formed by thermal oxidation. The compactness of the former is less than that of the latter. Therefore, while using hydrofluoric acid as an etchant to remove the pad oxide layer 102, the silicon oxide 110 in the trench 106 is etched at a rate higher than that for pad oxide layer 102. As a result, lateral etching occurs on the top surface of trench 106 to form a groove 116, which results in the less-smooth corner profile at the corner 114. Due to the lateral etching, the gate layer subsequently formed on the substrate will be thinner at the corner area 114 than in other places, so the kink effect will occur on the substrate.

Therefore, a need exists to improve the method for forming shallow trench isolations (STI) structure on a semiconductor substrate to eliminate the above mentioned problems.

SUMMARY OF THE INVENTION

It is therefore an object of the present invention to provide a method for forming a shallow trench isolation structure on a semiconductor substrate, such that the shallow trench isolation structure does not predispose occurrence of the kink effect.

To achieve the above objects and other advantages of the present invention, an improved method for forming shallow trench isolation structure is described. The present method comprises the steps of providing a pad oxide layer and a mask layer on a semiconductor substrate and forming a trench structure thereinto. Next, a liner oxide layer is formed on the surface of the trench structure in the semiconductor substrate and extensively formed on the side surface of the mask layer exposed therein and the top surface of the mask layer by wet oxidation. A dielectric material is deposited on the liner oxide layer and fills the trench structure. The dielectric material layer is planarized. The mask layer and the pad oxide layer are then removed to form the isolation structures. The method for forming the shallow trench structures on a semiconductor structure in accordance with the present invention can eliminate the kink effect that occur in the conventional method.

BRIEF DESCRIPTION OF THE DRAWINGS

Other objects, features, and advantages of the present invention will become apparent from the following detailed description of the preferred but non-limiting embodiments. The description is made with reference to the accompanying drawings in which.

DESCRIPTION OF THE PREFERRED EMBODIMENTS

Figure 1A:
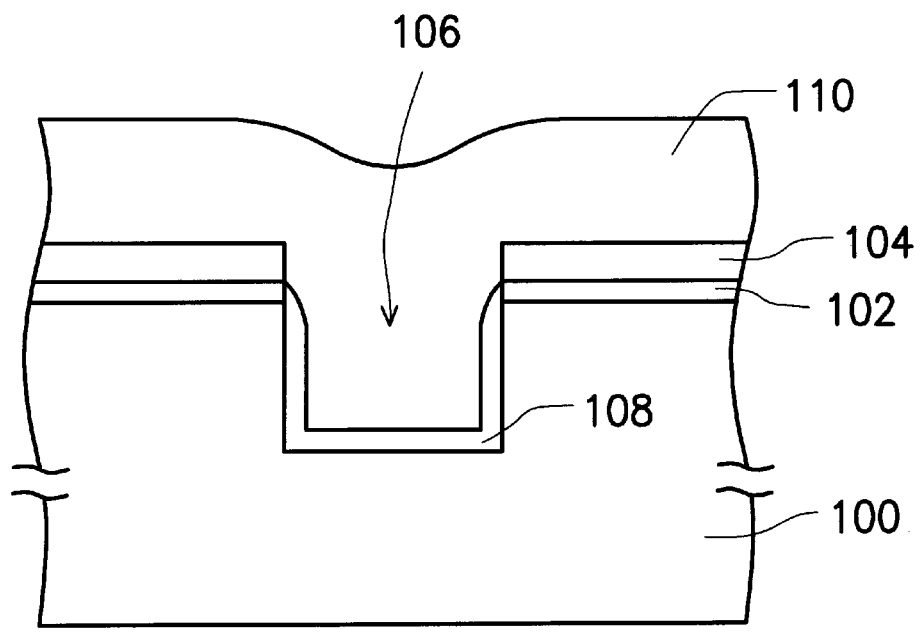
FIGS. 1A through 1B schematically illustrate in cross-sectional representation of the conventional method for forming a shallow trench isolation structure.
Figure 1B:
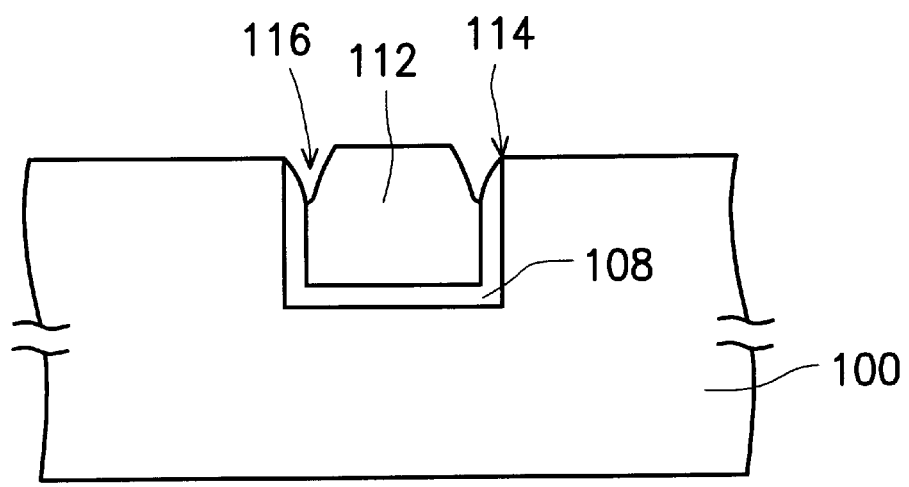
Figure 2A:
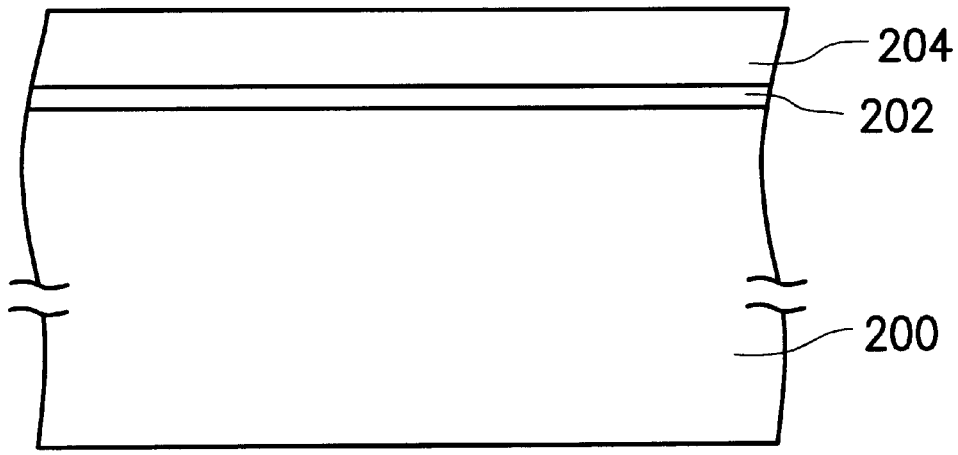
FIGS. 2A through 2F schematically illustrate in cross-sectional representation of one preferred embodiment of this invention.

With reference to FIG. 2A, a semiconductor substrate 200 is provided. A pad oxide layer 202 is formed on the semiconductor substrate by, for example, thermal oxidation. Next, a mask layer 204 is overlaid thereon. A suitable material for the mask layer used in performance of the present method is preferably one selected from the groups consisting of silicon nitride, silicon oxide nitride, polysilicon and amorphous silicon. Typically, the mask layer is formed by chemical vapor deposition.

Figure 2B:
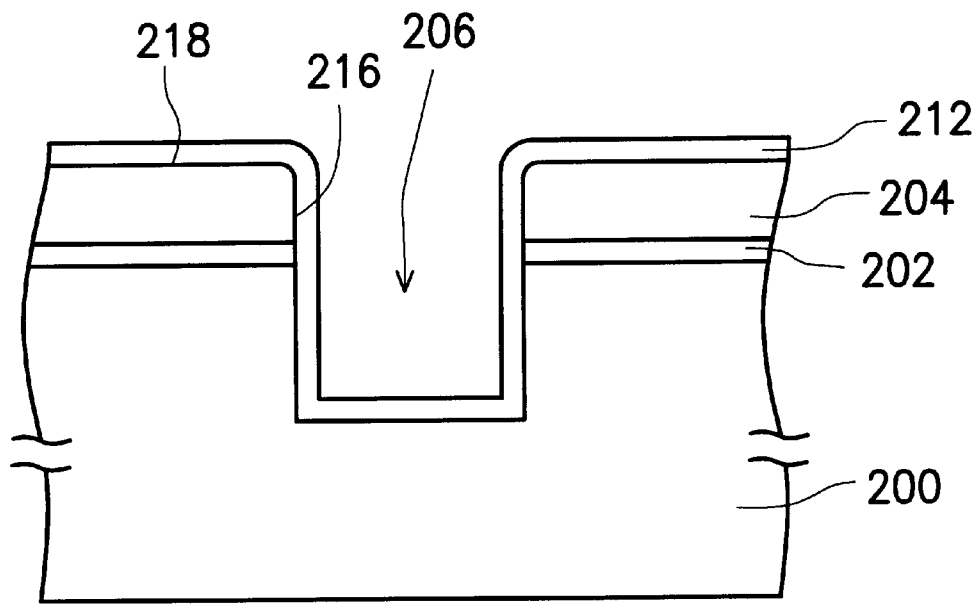

Now referring to FIG. 2B, the mask and pad oxide layers are defined for forming a trench structure 206 in the semiconductor substrate 200. In this process, the mask layer is used as a mask. The procedures for forming a trench structure on the semiconductor substrate typically comprise the steps of forming a photoresist layer (not shown in the drawings) on the mask layer, patterning the photoresist layer, subsequently etching the mask layer 204, the pad oxide layer 202 and the substrate 200.

Still referring to FIG. 2B, after formation of the trench structure, a liner oxide layer 212 is formed on the surface of the trench structure in the semiconductor substrate and extensively formed on the sidewall 216 and the top surface 218 of the mask layer 204 by wet oxidation at a temperature of about 950° C. to 1180° C., preferably at a of about 1100° C. to 1150° C. Under this condition for wet oxidation, the liner oxide layer is formed on the topographic surface of the substrate 200. In performance of the present method, the wet oxidation can be performed in a furnace in the presence of the hydrogen. Furthermore, the wet oxidation can be performed by rapid thermal oxidation. Preferably, the thickness of the liner oxide layer is 100 Å to 350 Å.

Figure 2C:
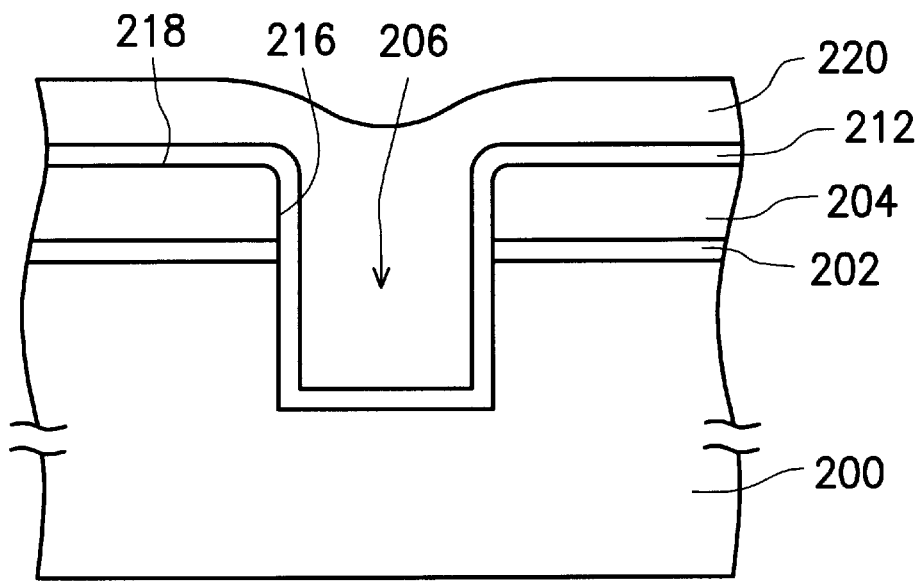

Now referring to FIG. 2C, a dielectric material layer 220 is formed to cover the liner oxide layer and fill the trench structure 206. An example of the dielectric material is silicon oxide. The dielectric material layer is formed by chemical vapor deposition or high-density plasma chemical vapor deposition with, for example, tetraethyloxy silicon as a gas source. Preferably, the dielectric material 220 is thermally treated at a temperature of about 1000° C. for about 10 to about 30 minutes for densification thereof after deposited by chemical vapor deposition.

Figure 2D:
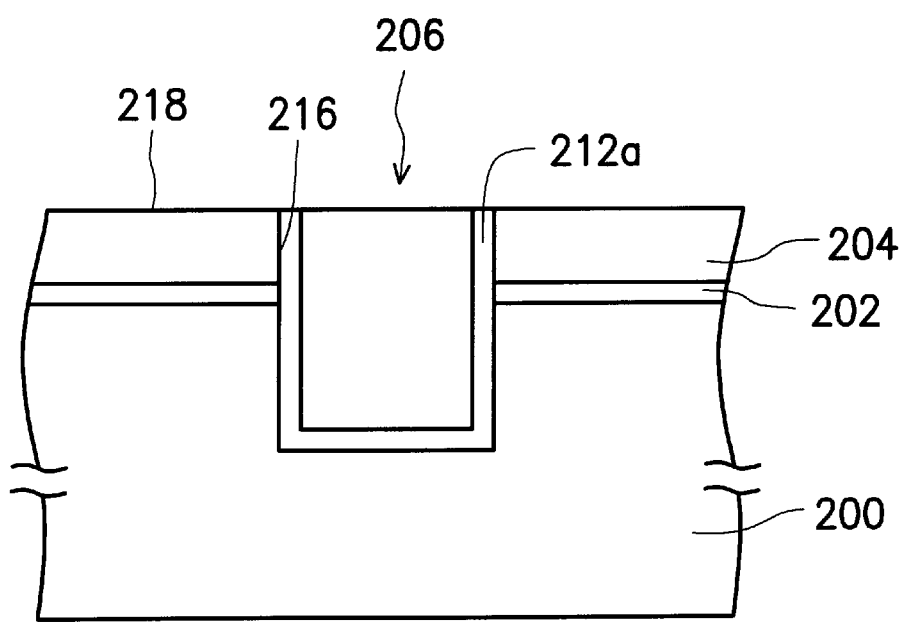

Turning to FIG. 2D, the resulting dielectric material layer over the substrate is planarized by, for example, chemical mechanical polishing. This planarization treatment is preferred to use the mask layer as a stop layer so that the layers of dielectric material 220 and liner oxide 212 are removed.

Figure 2E:
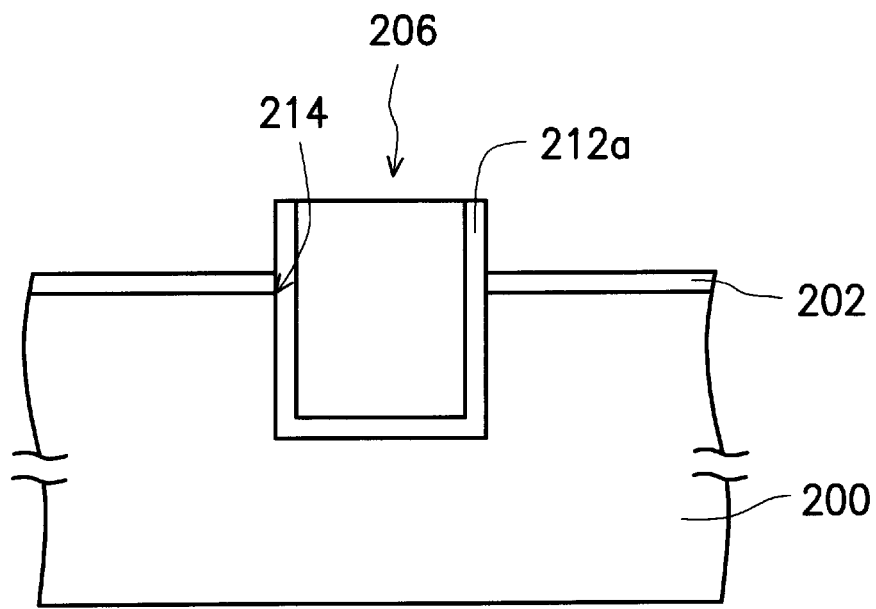

Referring to FIG. 2E, the mask layer 204 is typically removed by wet etching. In the case that the mask material 204 is silicon nitride, the mask layer 204 is preferably etched by heated phosphoric acid. Since the etching rate of layers of liner oxide 212 and mask 204 are different, when removing the mask layer 204, the portion 212a of liner oxide layer 212 which formed on the sidewall 216 (as shown in FIGS. 2C and 2D) of mask layer 204 exposed in the trench still remains to protect the trench structure 206 in the semiconductor substrate.

Figure 2F:
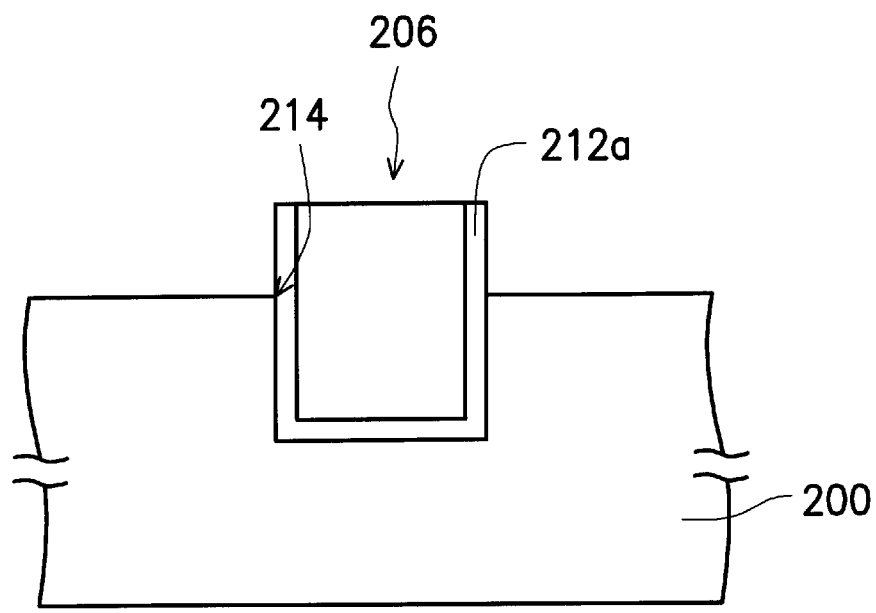

Then, as shown in FIG. 2F, the pad oxide layer 202 is removed by, for example, wet etching. Typically, the suitable etchant used in performance of the present method is hydrofluoric acid. Because the compactness of the liner oxide and pad oxide are different, when removing the pad oxide layer 202 by wet etching, the liner oxide layer 212a still remains to protect the trench structure 206 from lateral etching as that occurs in the conventional method. Therefore, the corner profile in the trench isolation structure formed by the present method is smooth.

Accordingly, the present method for forming the shallow trench structures on a semiconductor structure can eliminate the kink effect that occurs in the conventional method.

While the invention has been particularly shown and described with reference to the preferred embodiment but not limited thereto, it is realized that other modifications and changes will occur to those skilled in the art. It is therefore to be understood that the appended claims are intended to cover all modifications and changes as fall within the true spirit and scope of the invention.

What is claimed is:

1. A method for forming a shallow trench isolation structure on a semiconductor substrate, comprising the steps of:

providing a pad oxide layer and a mask layer on the semiconductor substrate;

forming a trench in the pad oxide layer, the mask layer, and the semiconductor substrate;

forming a liner oxide layer by a wet oxidation on a surface of the trench in the semiconductor substrate and extensively on a sidewall of the mask layer exposed therein and a top surface of the mask layer, wherein the wet oxidation is performed with presence of hydrogen;

depositing a dielectric material layer on the liner oxide layer and filling the trench therewith;

planarizing the dielectric material layer to expose the mask layer and removing the mask layer and the pad oxide layer to form the isolation structure, wherein the liner oxide layer extends to a top surface of the dielectric material layer; and removing the pad oxide layer and the mask layer to expose the substrate, wherein the liner oxide layer remains to protect the dielectric material layer filled in the trench.

2. The method as claimed in claim 1, wherein the wet oxidation is performed at a temperature of about 950° C. to 1180° C.

3. The method as claimed in claim 1, wherein the wet oxidation is performed at a temperature of about 1100° C. to 1150° C.

4. The method as claimed in claim 1, wherein the wet oxidation is performed in a furnace.

5. The method as claimed in claim 1, wherein the wet oxidation is a rapid thermal oxidation.

6. The method as claimed in claim 1, wherein a material for the mask layer is selected from the group consisting of silicon nitride, silicon oxide nitride, polysilicon and amorphous silicon.

7. A method for forming a shallow trench isolation structure on a semiconductor substrate, comprising the steps of:

providing a pad oxide layer and a mask layer on the semiconductor substrate;

forming a trench in the pad oxide layer, the mask layer, and the semiconductor substrate;

forming a liner oxide layer on a surface of the trench in the semiconductor substrate and extensively on a sidewall of the mask layer exposed therein and a top surface of the mask layer, wherein the liner oxide layer is formed by wet oxidation with presence of hydrogen at a temperature of about 950° C. to 1180° C.;

depositing a dielectric material layer on the liner oxide layer and filling the trench therewith;

planarizing the dielectric material layer to expose the mask layer and removing the mask layer and the pad oxide layer to form the isolation structure, wherein the liner oxide layer extends to a top surface of the dielectric material layer; and removing the pad oxide layer and the mask layer to expose the substrate, wherein the liner oxide layer remains to protect the dielectric material layer filled in the trench.

8. The method as claimed in claim 7, wherein the wet oxidation is performed at a temperature of about 1100° C. to 1150° C.

9. The method as claimed in claim 7, wherein the wet oxidation is performed in a furnace.

10. The method as claimed in claim 7, wherein the wet oxidation is a rapid thermal oxidation.

11. The method as claimed in claim 7, wherein a material for the mask layer is selected from the group consisting of silicon nitride, silicon oxide nitride, polysilicon and amorphous silicon.

* * * * *